(12) United States Patent
Kryliouk

(10) Patent No.: US 8,110,889 B2
(45) Date of Patent: Feb. 7, 2012

(54) MOCVD SINGLE CHAMBER SPLIT PROCESS FOR LED MANUFACTURING

(75) Inventor: Olga Kryliouk, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/730,975

(22) Filed: Mar. 24, 2010

(65) Prior Publication Data

US 2010/0273290 A1 Oct. 28, 2010

Related U.S. Application Data

(60) Provisional application No. 61/173,552, filed on Apr. 28, 2009.

(51) Int. Cl.
*H01L 21/20* (2006.01)
*H01L 21/36* (2006.01)

(52) U.S. Cl. ......... 257/493; 257/E21.085; 257/E21.097; 257/E21.108; 257/E21.117; 438/478; 438/492

(58) Field of Classification Search ........... 257/E21.085, 257/E21.097, E21.108, E21.117; 438/478, 438/492, 493
See application file for complete search history.

(56) References Cited

U.S. PATENT DOCUMENTS

| | | | |
|---|---|---|---|
| 4,851,295 A | 7/1989 | Brors | |
| D329,839 S | 9/1992 | Ehrhart | |
| 5,273,588 A | 12/1993 | Foster et al. | |
| 5,348,911 A | 9/1994 | Jurgensen et al. | |
| 5,647,911 A | 7/1997 | Vanell et al. | |
| 5,667,592 A | 9/1997 | Boitnott et al. | |
| 5,715,361 A | 2/1998 | Moslehi | |
| 5,762,755 A | 6/1998 | McNeilly et al. | |
| 5,814,239 A | 9/1998 | Kaneko et al. | |
| 5,855,675 A | 1/1999 | Doering et al. | |
| 5,858,471 A | 1/1999 | Ray et al. | |
| 5,871,586 A | 2/1999 | Crawley et al. | |
| 5,963,834 A | 10/1999 | Hatano et al. | |
| 6,086,673 A | 7/2000 | Molnar | |

(Continued)

FOREIGN PATENT DOCUMENTS

CN 1423834 6/2003

(Continued)

OTHER PUBLICATIONS

Office Action, U.S. Appl. No. 11/925,615 dated Nov. 19, 2010.

(Continued)

*Primary Examiner* — Asok Sarkar
(74) *Attorney, Agent, or Firm* — Patterson & Sheridan, L.L.P.

(57) ABSTRACT

In one embodiment a method for fabricating a compound nitride semiconductor device comprising positioning one or more substrates on a susceptor in a processing region of a metal organic chemical vapor deposition (MOCVD) chamber comprising a showerhead, depositing a gallium nitride layer over the substrate with a thermal chemical-vapor-deposition process within the MOCVD chamber by flowing a first gallium containing precursor and a first nitrogen containing precursor through the showerhead into the MOCVD chamber, removing the one or more substrates from the MOCVD chamber without exposing the one or more substrates to atmosphere, flowing a chlorine gas into the processing chamber to remove contaminants from the showerhead, transferring the one or more substrates into the MOCVD chamber after removing contaminants from the showerhead, and depositing an InGaN layer over the GaN layer with a thermal chemical-vapor-deposition process within the MOCVD chamber is provided.

17 Claims, 8 Drawing Sheets

U.S. PATENT DOCUMENTS

| | | | |
|---|---|---|---|
| 6,156,581 A | 12/2000 | Vaudo et al. | |
| 6,176,936 B1 | 1/2001 | Taguwa | |
| 6,200,893 B1 | 3/2001 | Sneh | |
| 6,206,972 B1 | 3/2001 | Dunham | |
| 6,242,347 B1 * | 6/2001 | Vasudev et al. | 438/680 |
| 6,270,569 B1 | 8/2001 | Shibata et al. | |
| 6,274,495 B1 | 8/2001 | Omstead et al. | |
| 6,305,314 B1 | 10/2001 | Sneh et al. | |
| 6,309,465 B1 | 10/2001 | Jurgensen et al. | |
| 6,451,119 B2 | 9/2002 | Sneh et al. | |
| 6,451,695 B2 | 9/2002 | Sneh | |
| 6,451,713 B1 | 9/2002 | Tay et al. | |
| 6,464,843 B1 | 10/2002 | Wicker et al. | |
| 6,475,910 B1 | 11/2002 | Sneh | |
| 6,503,330 B1 | 1/2003 | Sneh et al. | |
| 6,508,197 B1 | 1/2003 | Omstead et al. | |
| 6,528,394 B1 | 3/2003 | Lee et al. | |
| 6,540,838 B2 | 4/2003 | Sneh et al. | |
| 6,551,399 B1 | 4/2003 | Sneh et al. | |
| 6,562,720 B2 | 5/2003 | Thilderkvist et al. | |
| 6,562,730 B2 | 5/2003 | Jeng et al. | |
| 6,569,765 B1 | 5/2003 | Solomon et al. | |
| 6,602,784 B2 | 8/2003 | Sneh | |
| 6,616,766 B2 | 9/2003 | Dunham | |
| 6,616,870 B1 | 9/2003 | Goela et al. | |
| 6,630,401 B2 | 10/2003 | Sneh | |
| 6,638,859 B2 | 10/2003 | Sneh et al. | |
| 6,638,862 B2 | 10/2003 | Sneh | |
| 6,660,083 B2 | 12/2003 | Tsvetkov et al. | |
| 6,733,591 B2 | 5/2004 | Anderson | |
| 6,849,241 B2 | 2/2005 | Dauelsberg et al. | |
| 6,897,119 B1 | 5/2005 | Sneh et al. | |
| 6,902,990 B2 | 6/2005 | Gottfried et al. | |
| 6,903,025 B2 | 6/2005 | Mizushima | |
| 6,905,547 B1 | 6/2005 | Londergan et al. | |
| 6,921,437 B1 | 7/2005 | DeDontney et al. | |
| 6,927,426 B2 | 8/2005 | Matsuoka et al. | |
| 6,962,624 B2 | 11/2005 | Jurgensen et al. | |
| 6,964,876 B2 | 11/2005 | Heuken | |
| 6,972,050 B2 | 12/2005 | Bremser et al. | |
| 6,983,620 B2 | 1/2006 | Kaeppeler | |
| 7,018,940 B2 | 3/2006 | Dunham | |
| 7,033,921 B2 | 4/2006 | Jurgensen | |
| 7,078,318 B2 | 7/2006 | Jurgensen et al. | |
| 7,115,896 B2 | 10/2006 | Guo et al. | |
| 7,128,785 B2 | 10/2006 | Kaeppeler et al. | |
| 7,147,718 B2 | 12/2006 | Jurgensen et al. | |
| 7,364,991 B2 | 4/2008 | Bour et al. | |
| 7,368,368 B2 | 5/2008 | Emerson | |
| 7,625,448 B2 | 12/2009 | Dauelsberg et al. | |
| 7,682,940 B2 | 3/2010 | Ye et al. | |
| 2001/0050059 A1 | 12/2001 | Hongo et al. | |
| 2004/0129671 A1 | 7/2004 | Ji et al. | |
| 2004/0221809 A1 | 11/2004 | Ohmi et al. | |
| 2006/0021568 A1 | 2/2006 | Matsumoto | |
| 2006/0154455 A1 | 7/2006 | Guo et al. | |
| 2006/0205199 A1 | 9/2006 | Baker et al. | |
| 2007/0010033 A1 | 1/2007 | Aderhold et al. | |
| 2007/0240631 A1 | 10/2007 | Nijhawan et al. | |
| 2007/0259502 A1 | 11/2007 | Bour et al. | |
| 2008/0050889 A1 | 2/2008 | Bour et al. | |
| 2008/0206464 A1 | 8/2008 | Kappeler | |
| 2009/0095221 A1 | 4/2009 | Tam et al. | |
| 2009/0095222 A1 | 4/2009 | Tam et al. | |
| 2009/0095713 A1 | 4/2009 | Dimeo, Jr. et al. | |
| 2009/0098276 A1 | 4/2009 | Burrows et al. | |
| 2009/0149008 A1 | 6/2009 | Kryliouk et al. | |
| 2009/0194024 A1 | 8/2009 | Burrows et al. | |
| 2009/0194026 A1 | 8/2009 | Burrows et al. | |

FOREIGN PATENT DOCUMENTS

| | | |
|---|---|---|
| JP | 2004-140328 A | 5/2004 |
| JP | 2007-154297 A | 6/2007 |
| JP | 2008-066490 A | 3/2008 |
| KR | 10-0578089 B1 | 5/2006 |
| WO | WO-2009099721 A2 | 8/2009 |

OTHER PUBLICATIONS

Motoki, et al. "Preparation of Large Freestanding GaN Substrates by Hydride Vapor Phase Epitaxy Using GaAs as a Starting Substrate", JP Appl. Phys. vol. 40 (2001) pp. L140-L143. Part 2. No. 2B. Feb. 15, 2001.

Kikuchi, et al. "Thermodynamic Analysis of Various Types of Hydride Vapor Phase Epitaxy System for High-Speed Growth of InN", 2006, Japanese Journal of Appiled Physics, vol. 45 No. 45, pp. L1203-L1205.

Kelly, et al. "Large Free-Standing GaN Substrates by Hydride Vapor Phase Epitaxy and Laser-Induced Liftoff", JP Appl. Phys. vol. 38 (1999) pp. L217-L219. Part 2. No. 3A. Mar. 1, 1999.

Park, et al. "Free-Standing GaN Substrates by Hydride Vapor Phase Epitaxy", JP Appl. Phys. vol. 39 (2000) pp. L1141-L1142. Part 2. No. 11B. Nov. 15, 2000.

Ban, Vladimir S. "Mass Spectrometric Studies of Vapor-Phase Crystal Growth", vol. 119, Issue 6. pp. 761-765. Jun. 1972.

International Search Report, PCT/US2010/030492 dated Oct. 27, 2010.

Office Action, U.S. Appl. No. 11/767,520 dated Sep. 8, 2010.

International Search Report, PCT/US2010/032597 dated Dec. 1, 2010.

International Search Report, PCT/US2010/032313 dated Dec. 6, 2010.

Chinese Office Action for Application No. 200810168234.1 dated Aug. 16, 2010.

Bohnen, et al, "Enhanced Growth Rates and Reduced Parasitic Deposition by the Substitution of $Cl_2$ for HCl in GaN HVPE", Journal of Crystal Growth 312 (2010) 2542-2550.

International Search Report and Written Opinion of the International Searching Authority mailed Dec. 23, 2010 in PCT/US2010/032592.

International Search Report and Written Opinion of the International Searching Authority mailed Nov. 26, 2010 in PCT/US2010/032032.

* cited by examiner

MOCVD SINGLE CHAMBER SPLIT PROCESS FOR LED MANUFACTURING

CROSS-REFERENCE TO RELATED APPLICATIONS

This application claims benefit of U.S. provisional patent application Ser. No. 61/173,552 (14309L), filed Apr. 28, 2009, which is herein incorporated by reference it its entirety.

BACKGROUND OF THE INVENTION

1. Field of the Invention

Embodiments of the present invention generally relate to the manufacturing of devices, such as light emitting diodes (LEDs), laser diodes (LDs) and, more particularly, to processes for forming Group III-V materials by metal-organic chemical vapor deposition (MOCVD) deposition processes.

2. Description of the Related Art

Group III-V films are finding greater importance in the development and fabrication of a variety of semiconductor devices, such as short wavelength LEDs, LDs, and electronic devices including high power, high frequency, high temperature transistors and integrated circuits. For example, short wavelength (e.g., blue/green to ultraviolet) LEDs are fabricated using the Group III-nitride semiconducting material gallium nitride (GaN). It has been observed that short wavelength LEDs fabricated using GaN can provide significantly greater efficiencies and longer operating lifetimes than short wavelength LEDs fabricated using non-nitride semiconducting materials, comprising Group II-VI elements.

One method that has been used for depositing Group III-nitrides, such as GaN, is metal organic chemical vapor deposition (MOCVD). This chemical vapor deposition method is generally performed in a reactor having a temperature controlled environment to assure the stability of a first precursor gas which contains at least one element from Group III, such as gallium (Ga). A second precursor gas, such as ammonia ($NH_3$), provides the nitrogen needed to form a Group III-nitride. The two precursor gases are injected into a processing zone within the reactor where they mix and move towards a heated substrate in the processing zone. A carrier gas may be used to assist in the transport of the precursor gases towards the substrate. The precursors react at the surface of the heated substrate to form a Group III-nitride layer, such as GaN, on the substrate surface. The quality of the film depends in part upon deposition uniformity which, in turn, depends upon uniform flow and mixing of the precursors across the substrate.

Unwanted deposition on the interior surfaces such as the walls and the showerheads of the MOCVD processing chambers may occur during MOCVD processes. Such unwanted deposition may create particles and flakes within the chamber, resulting in the drift of process conditions and more importantly affecting the process reproducibility and uniformity.

As the demand for LEDs, LDs, transistors, and integrated circuits increases, the efficiency of depositing high quality Group-III nitride films takes on greater importance. Therefore, there is a need for an improved process and apparatus that can provide consistent film quality over larger substrates and larger deposition areas.

SUMMARY OF THE INVENTION

Embodiments described herein generally relate to methods for forming Group III-V materials by metal-organic chemical vapor deposition (MOCVD) processes. In one embodiment, a method for fabricating a compound nitride semiconductor structure is provided. The method comprises depositing a first layer over one or more substrates with a thermal chemical-vapor-deposition process within a processing chamber using a first group-III precursor comprising a first group-III element and a first nitrogen containing precursor, wherein the first layer comprises nitrogen and the first group-III element, removing the one or more substrates from the processing chamber after depositing a first layer without exposing the one or more substrates to atmosphere, flowing a first cleaning gas into the processing chamber to remove contaminants from the processing chamber after removing the one or more substrates from the processing chamber after depositing a first layer, transferring the one or more substrates into the processing chamber without exposing the one or more substrates to atmosphere after removing contaminants from the processing chamber; and depositing a second layer over the first layer with a thermal chemical-vapor-deposition process within the processing chamber using a second group-III precursor and a second nitrogen containing precursor, wherein the second group-III precursor comprises a second group-III element not comprised by the first group-III precursor.

In another embodiment, a method for fabricating a compound nitride semiconductor structure is provided. The method comprises positioning one or more substrates on a susceptor in a processing region of a metal organic chemical vapor deposition (MOCVD) chamber comprising a showerhead, depositing a gallium nitride layer over the substrate with a thermal chemical-vapor-deposition process within the MOCVD chamber by flowing a first gallium containing precursor and a first nitrogen containing precursor through the showerhead into the MOCVD chamber, removing the one or more substrates from the MOCVD chamber without exposing the one or more substrates to atmosphere, flowing a chlorine gas into the processing chamber to remove contaminants from the showerhead, transferring the one or more substrates into the MOCVD chamber after removing contaminants from the showerhead; and depositing an InGaN layer over the GaN layer with a thermal chemical-vapor-deposition process within the MOCVD chamber by flowing a second gallium containing precursor, an indium containing precursor, and a second nitrogen containing precursor into the MOCVD chamber.

In yet another embodiment, an integrated processing system for manufacturing compound nitride semiconductor devices is provided. The integrated processing system comprises a metal organic chemical vapor deposition (MOCVD) operable to form a gallium nitride (GaN) layer over one or more substrates with a thermal chemical-vapor-deposition process and to form a multi-quantum well (MQW) layer over the GaN layer and a halogen containing gas source coupled with the MOCVD chamber operable for flowing a halogen containing gas into the MOCVD chamber to remove at least a portion of unwanted deposition build-up deposited when forming the GaN layer over the one or more substrate from one or more interior surfaces of the MOCVD chamber prior to forming the MQW layer over the GaN layer, wherein the halogen containing gas is selected from the group comprising fluorine, chlorine, bromine, iodine, HI gas, HCl gas, HBr gas, HF gas, $NF_3$, and combinations thereof.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments described herein generally relate to methods for forming Group III-V materials by MOCVD processes. In one embodiment, an in-situ chamber clean process is performed after deposition of a $III_1$-N layer on a substrate and prior to deposition of a $III_2$-N layer on the substrate in the same chamber. In one embodiment an in-situ chamber clean process is performed after a high temperature GaN deposition process and prior to InGaN multi-quantum well (MQW), AlGaN, and pGaN growth in the same chamber. It has been found by the inventors that performing MQW deposition in the same chamber as GaN deposition after an in-situ chamber clean process eliminates indium depletion in the gas phase. As a result, tri-methyl indium (TMI) input flow is also significantly reduced, for example, a TMI flow rate of 400-500 sccm is used for InGaN MQW growth after performing the chamber clean process as compared to a flow rate of 800-1200 sccm for in-situ InGaN MQW growth performed without the chamber clean process. Moreover, after a chamber clean process, indium deposition is more uniform across the substrate which results in desirable photoluminescence (PL) wavelength uniformity. In one embodiment, the chamber clean process is performed by flowing a halogen containing cleaning gas, such as chlorine gas, into the MOCVD chamber to convert the gallium coating on the surfaces of the chamber and the chamber components into $GaCl_3$ which may then be removed from the chamber.

While the particular apparatus in which the embodiments described herein can be practiced is not limited, it is particularly beneficial to practice the embodiments in a cluster tool system sold by Applied Materials, Inc., Santa Clara, Calif. Additionally, systems available from other manufacturers including linear systems may also benefit from embodiments described herein.

Figure 1A:
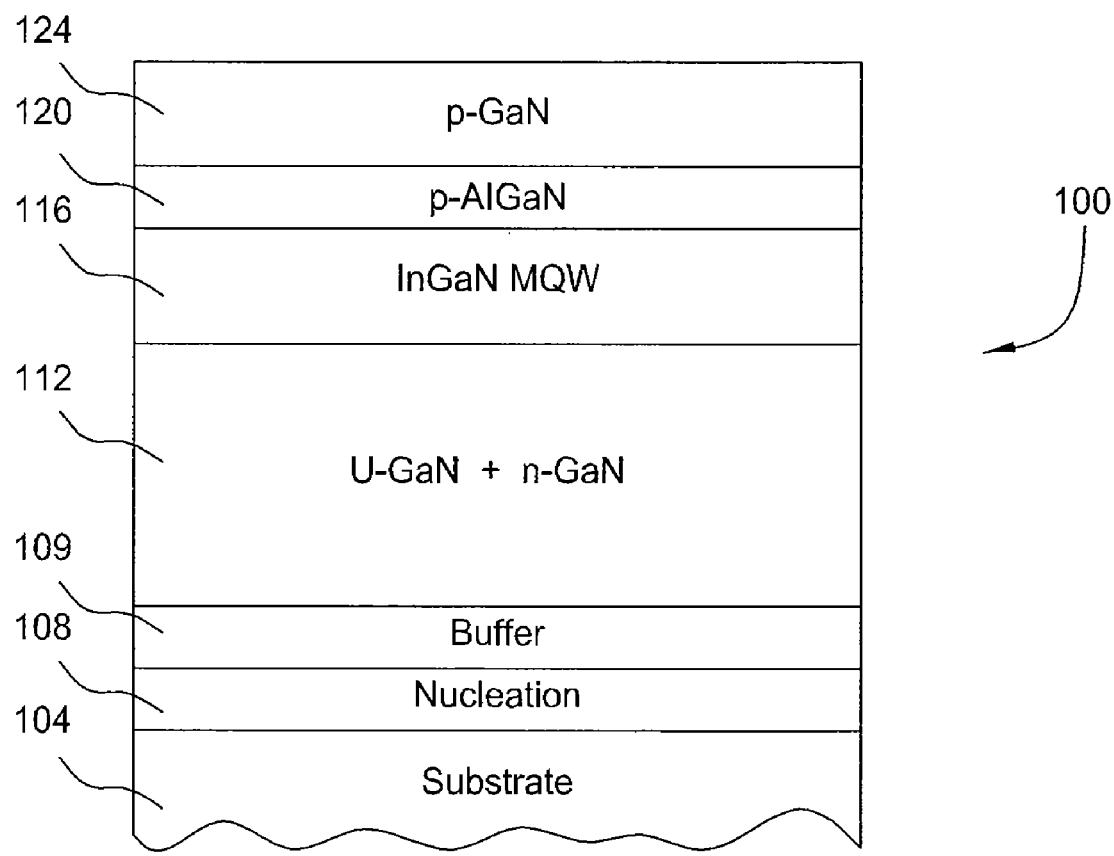
FIG. 1A is a schematic illustration of a structure of a GaN-based LED.

Currently, MOCVD techniques are the most widely used techniques for the growth of Group III-nitride based LED manufacturing. One typical nitride-based structure is illustrated in FIG. 1A as a GaN-based LED structure 100. It is fabricated over a substrate 104. Substrate size may range from 50 mm-100 mm in diameter or larger. It is to be understood that the substrates may consist of at least one of sapphire, SiC, GaN, silicon, quartz, GaAs, AlN, and glass. An undoped gallium nitride (u-GaN layer) followed by an n-type GaN layer 112 is deposited over an optional buffer layer 109 (e.g. GaN) and/or an optional seed/nucleation layer 108 (e.g. aluminum nitride (AlN) formed over the substrate. In one embodiment, the nucleation layer 108 comprises $Al_xGa_{1-x}N$ and the substrate 104 comprises AlN. In another embodiment, the buffer layer 109 comprises GaN and is deposited on the nucleation layer 108 which comprises $Al_xGa_{1-x}N$. An active region of the device is embodied in a multi-quantum-well layer 116, shown in the drawing to comprise an InGaN layer. A p-n junction is formed with an overlying p-type AlGaN layer 120, with a p-type GaN layer 124 acting as a contact layer.

A typical fabrication process for such an LED may use a MOCVD process that follows cleaning of the substrate 104 in a processing chamber. The MOCVD deposition is accomplished by providing flows of suitable precursors to the processing chamber and using thermal processes to achieve deposition. For example, a GaN layer may be deposited using Ga and nitrogen containing precursors, perhaps with a flow of a fluent gas like $N_2$, $H_2$, and $NH_3$. An InGaN layer may be deposited using Ga, N, and In precursors, perhaps with a flow of a fluent gas. An AlGaN layer may be deposited using Ga, N, and Al precursors, also perhaps with a flow of a fluent gas. In the illustrated structure 100, the GaN buffer layer 108 has a thickness of about 500 Å, and may have been deposited at a temperature of about 550° C. Subsequent deposition of the u-GaN and n-GaN layer 112 is typically performed at a higher temperature, such as around 1,050° C. in one embodiment. The u-GaN and n-GaN layer 112 is relatively thick. In one embodiment, the u-GaN and n-GaN layer has a thickness on the order of about 4 μm requiring about 140 minutes for deposition. In one embodiment, the InGaN multi-quantum-well (MQW) layer 116 may have a thickness of about 750 Å, which may be deposited over a period of about 40 minutes at a temperature of about 750° C. In one embodiment, the p-AlGaN layer 120 may have a thickness of about 200 Å, which may be deposited in about five minutes at a temperature from about 950° C. to about 1,020° C. In one embodiment, the thickness of the contact layer 124 that completes the structure may be about 0.4 μm, and may be deposited at a temperature of about 1,050° C. for around 25 minutes. Additionally, dopants, such as silicon (Si) or magnesium (Mg), may be added to the films. The films may be doped by adding small amounts of dopant gases during the deposition process. For silicon doping, silane ($SiH_4$) or disilane ($Si_2H_6$) gases may be used, for example, and a dopant gas may include Bis(cyclopentadienyl) magnesium ($Cp_2Mg$ or $(C_5H_5)_2Mg$) for magnesium doping.

Figure 1B:
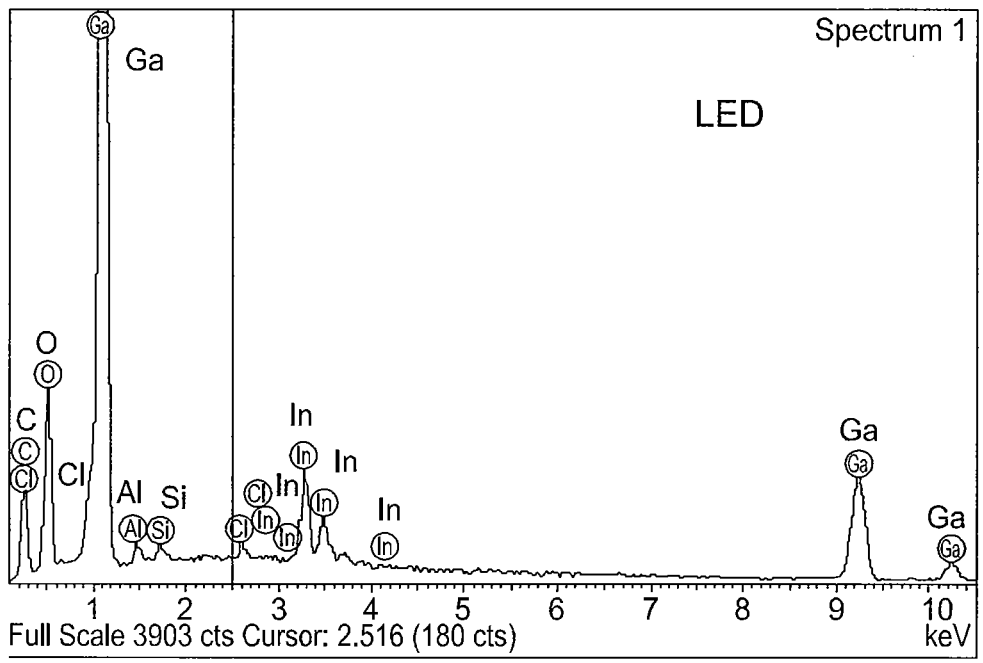
FIG. 1B is an EDX spectrum of showerhead deposition after growth of a LED structure.
Figure 1C:
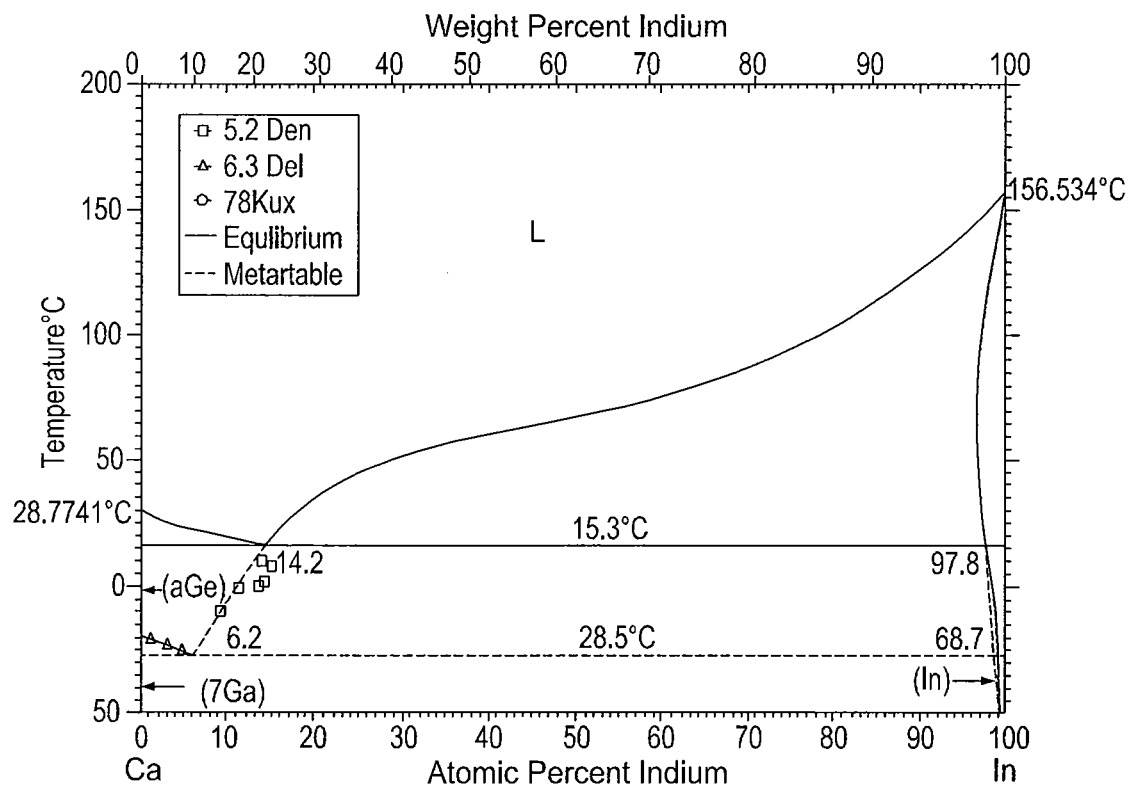
FIG. 1C is a gallium-indium phase diagram.

When the aforementioned steps are performed in a single MOCVD chamber, the growth of GaN at high temperatures results in severe parasitic deposition of Ga metal and GaN within the MOCVD chamber, especially on chamber components including the showerhead or gas distribution assembly of the MOCVD chamber. As shown in FIG. 1B, this parasitic deposition is generally rich in gallium. Gallium rich depositions cause problems due to the nature of gallium itself which acts as a trap, reacting with the gas phase precursors used for deposition of subsequent single layers of LED, such as, for example, tri-methyl indium (TMI), tri-methyl aluminum (TMA), n-type dopants such as silane ($SiH_4$) and disilane ($Si_2H_6$), and p-type dopants such as $Cp_2Mg$. InGaN multi-quantum wells (MQW) are the most affected due to Ga—In eutectic formation, shown in FIG. 1C, at favorable conditions within the MOCVD chamber leading to PL wavelength drift, PL intensity reduction, and device degradation in general.

Figure 2:
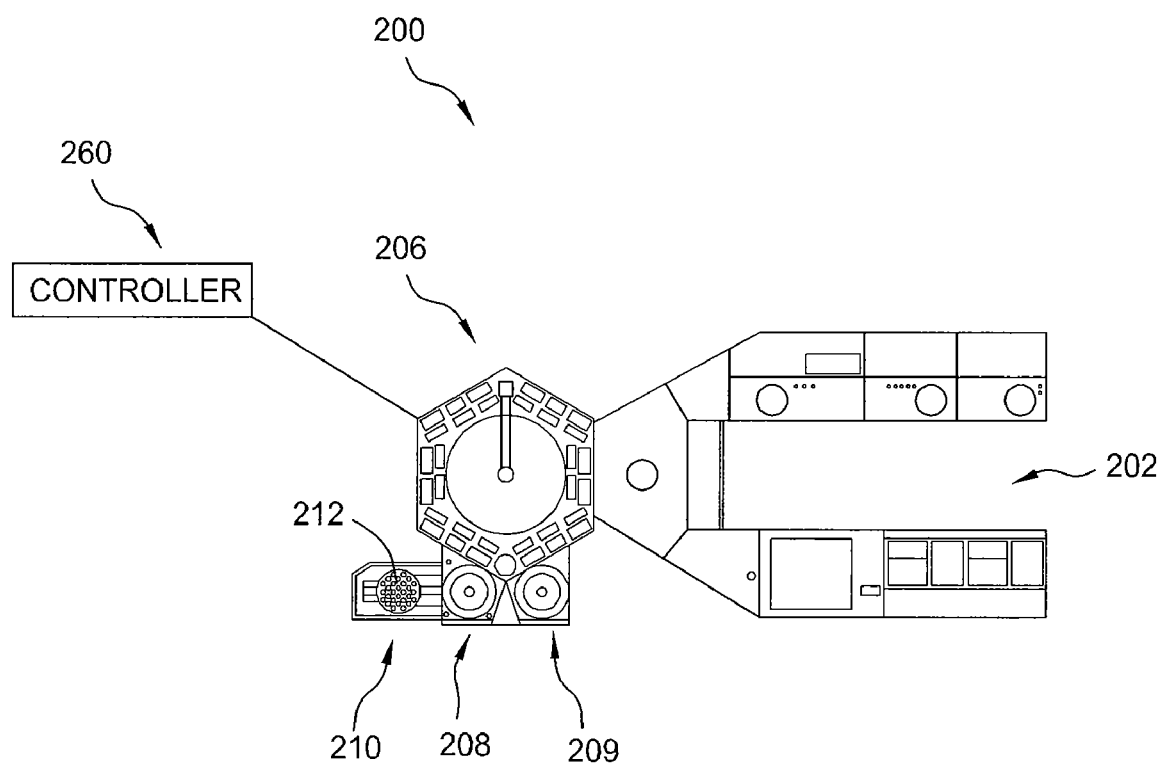
FIG. 2 is a schematic top view illustrating one embodiment of a processing system for fabricating compound nitride semiconductor devices according to embodiments described herein.

FIG. 2 is a schematic top view illustrating one embodiment of a processing system 200 that comprises a single MOCVD chamber 202 for fabricating compound nitride semiconductor devices according to embodiments described herein. In one embodiment, the processing system 200 is closed to atmosphere. Although one MOCVD chamber 202 is shown, it should be understood that more than one MOCVD chamber 202 or additionally, combinations of one or more MOCVD chambers 202 with one or more Hydride Vapor Phase Epitaxial (HVPE) chamber may also be coupled with the transfer chamber 206. The processing system 200 comprises a transfer chamber 206 housing a substrate handler (not shown), a MOCVD chamber 202 coupled with the transfer chamber 206, a loadlock chamber 208 coupled with the transfer chamber 206, a batch loadlock chamber 209, for storing substrates, coupled with the transfer chamber 206, and a load station 210, for loading substrates, coupled with the loadlock chamber 208. The transfer chamber 206 comprises a robot assembly (not shown) operable to pick up and transfer substrates between the loadlock chamber 208, the batch loadlock chamber 209, and the MOCVD chamber 202. It should also be understood that although a cluster tool is shown, the embodiments described herein may be performed using linear track systems.

The transfer chamber 206 may remain under vacuum during the process. The transfer chamber vacuum level may be adjusted to match the vacuum level of the MOCVD chamber 202. For example, when transferring a substrate from a transfer chamber 206 into the MOCVD chamber 202 (or vice versa), the transfer chamber 206 and the MOCVD chamber 202 may be maintained at the same vacuum level. Then, when transferring a substrate from the transfer chamber 206 to the load lock chamber 208 or batch load lock chamber 209 (or vice versa), the transfer chamber vacuum level may match the vacuum level of the loadlock chamber 208 or batch load lock chamber 209 even through the vacuum level of the loadlock chamber 208 or batch load lock chamber 209 and the MOCVD chamber 202 may be different. Thus, the vacuum level of the transfer chamber may be adjusted. In certain embodiments, the substrate is transferred in a high purity inert gas environment, such as, a high purity $N_2$ environment. In one embodiment, the substrate is transferred in an environment having greater than 90% $N_2$. In certain embodiments, the substrate is transferred in a high purity $NH_3$ environment. In one embodiment, the substrate is transferred in an environment having greater than 90% $NH_3$. In certain embodiments, the substrate is transferred in a high purity $H_2$ environment. In one embodiment, the substrate is transferred in an environment having greater than 90% $H_2$.

In the processing system 200, the robot assembly transfers a substrate carrier plate 212 loaded with substrates into the single MOCVD chamber 202 to undergo deposition. In one embodiment, the substrate carrier plate 212 may range from 200 mm-750 mm. The substrate carrier may be formed from a variety of materials, including SiC or SiC-coated graphite. In one embodiment, the carrier plate 212 comprises a silicon carbide material. In one embodiment, the carrier plate 212 has a surface area of about 1,000 $cm^2$ or more, preferably 2,000 $cm^2$ or more, and more preferably 4,000 $cm^2$ or more. After all or some of the deposition steps have been completed, the carrier plate 212 is transferred from the MOCVD chamber 202 back to the loadlock chamber 208. In one embodiment, the carrier plate 212 is then released toward the load station 210. In another embodiment, the carrier plate 212 may be stored in either the loadlock chamber 208 or the batch load lock chamber 209 prior to further processing in the MOCVD chamber 202. One exemplary system is described in U.S. patent application Ser. No. 12/023,572, filed Jan. 31, 2008, now published as US 2009-0194026, titled PROCESSING SYSTEM FOR FABRICATING COMPOUND NITRIDE SEMICONDUCTOR DEVICES, which is hereby incorporated by reference in its entirety.

A system controller 260 controls activities and operating parameters of the processing system 200. The system controller 260 includes a computer processor and a computer-readable memory coupled to the processor. The processor executes system control software, such as a computer program stored in memory. Aspects of the processing system and methods of use are further described in U.S. patent application Ser. No. 11/404,516, filed Apr. 14, 2006, now published as US 2007-024,516, titled EPITAXIAL GROWTH OF COMPOUND NITRIDE STRUCTURES, which is hereby incorporated by reference in its entirety.

Figure 3:
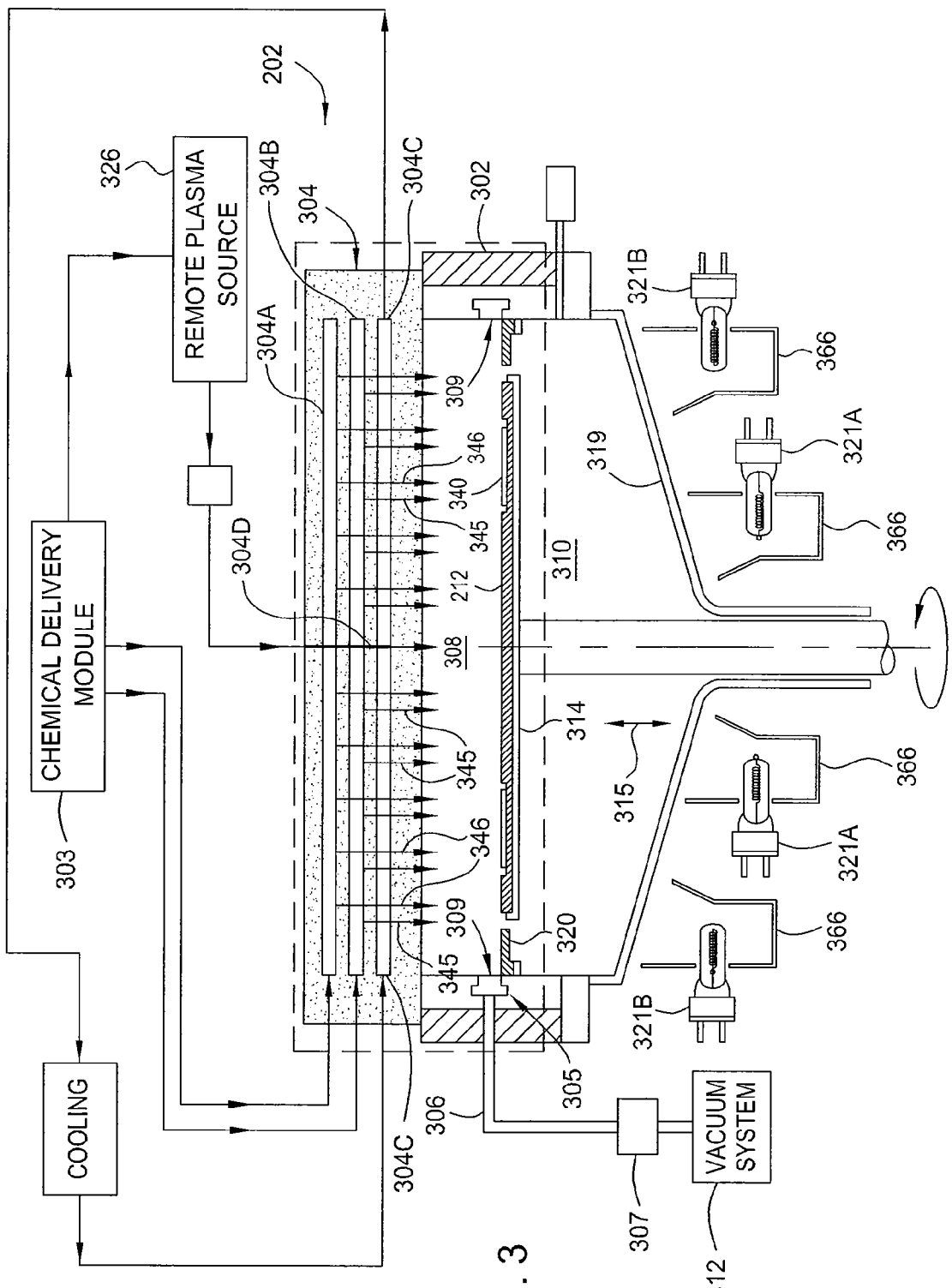
FIG. 3 is a schematic cross-sectional view of a metal-organic chemical vapor deposition (MOCVD) chamber for fabricating compound nitride semiconductor devices according to embodiments described herein.

FIG. 3 is a schematic cross-sectional view of an MOCVD chamber according to embodiments described herein. The MOCVD chamber 202 comprises a chamber body 302, a chemical delivery module 303 for delivering precursor gases, carrier gases, cleaning gases, and/or purge gases, a remote plasma system 326 with a plasma source, a susceptor or substrate support 314, and a vacuum system 312. The chamber 202 includes a chamber body 302 that encloses a processing volume 308. A showerhead assembly 304 is disposed at one end of the processing volume 308, and the carrier plate 212 is disposed at the other end of the processing volume 308. The carrier plate 212 may be disposed on the substrate support 314. The substrate support 314 has z-lift capability for moving in a vertical direction, as shown by arrow 315. In one embodiment, the z-lift capability may be used to move the substrate support either upward and closer to the showerhead assembly 304 or downward and further away from the showerhead assembly 304. In certain embodiments, the substrate support 314 comprises a heating element, for example, a resistive heating element (not shown) for controlling the temperature of the substrate support 314 and consequently controlling the temperature of the carrier plate 212 and substrates 340 positioned on the substrate support 314.

In one embodiment, the showerhead assembly 304 has a first processing gas channel 304A coupled with the chemical delivery module 303 for delivering a first precursor or first process gas mixture to the processing volume 308, a second processing gas channel 304B coupled with the chemical delivery module 303 for delivering a second precursor or second process gas mixture to the processing volume 308 and a temperature control channel 304C coupled with a heat exchanging system 370 for flowing a heat exchanging fluid to the showerhead assembly 304 to help regulate the temperature of the showerhead assembly 304. Suitable heat exchanging fluids include but are not limited to water, water-based ethylene glycol mixtures, a perfluoropolyether (e.g. Galden® fluid), oil-based thermal transfer fluids, or similar fluids. In one embodiment, during processing the first precursor or first process gas mixture may be delivered to the processing volume 308 via gas conduits 346 coupled with the first processing gas channel 304A in the showerhead assembly 304 and the second precursor or second process gas mixture may be delivered to the processing volume 308 via gas conduits 345 coupled with the second gas processing channel 304B. In embodiments where the remote plasma source is used, the plasma may be delivered to the processing volume 308 via conduit 304D. It should be noted that the process gas mixtures or precursors may comprise one or more precursor gases or process gases as well as carrier gases and dopant gases which may be mixed with the precursor gases. Exemplary showerheads that may be adapted to practice embodiments described herein are described in U.S. patent application Ser. No. 11/873,132, filed Oct. 16, 2007, now published as US 2009-0098276, entitled MULTI-GAS STRAIGHT CHANNEL SHOWERHEAD, U.S. patent application Ser. No. 11/873,141, filed Oct. 16, 2007, now published as US 2009-0095222, entitled MULTI-GAS SPIRAL CHANNEL SHOWERHEAD, and U.S. patent application Ser. No. 11/873,170, filed Oct. 16, 2007, now published as US 2009-0095221, entitled MULTI-GAS CONCENTRIC INJECTION SHOWERHEAD, all of which are incorporated by reference in their entireties.

A lower dome 319 is disposed at one end of a lower volume 310, and the carrier plate 212 is disposed at the other end of the lower volume 310. The carrier plate 212 is shown in process position, but may be moved to a lower position where, for example, the substrates 340 may be loaded or unloaded. An exhaust ring 320 may be disposed around the periphery of the carrier plate 212 to help prevent deposition from occurring in the lower volume 310 and also help direct exhaust gases from the chamber 202 to exhaust ports 309. The lower dome 319 may be made of transparent material, such as high-purity quartz, to allow light to pass through for radiant heating of the substrates 340. The radiant heating may be provided by a plurality of inner lamps 321A and outer lamps 321B disposed below the lower dome 319 and reflectors 366 may be used to help control the chamber 202 exposure to the radiant energy provided by inner and outer lamps 321A, 321B. Additional rings of lamps may also be used for finer temperature control of the substrates 340.

In certain embodiments, a purge gas (e.g., a nitrogen containing gas) may be delivered into the chamber 202 from the showerhead assembly 304 and/or from inlet ports or tubes (not shown) disposed below the carrier plate 212 and near the bottom of the chamber body 302. The purge gas enters the lower volume 310 of the chamber 202 and flows upwards past the carrier plate 212 and exhaust ring 320 and into multiple exhaust ports 309 which are disposed around an annular exhaust channel 305. An exhaust conduit 306 connects the annular exhaust channel 305 to a vacuum system 312 which includes a vacuum pump 307. The chamber 202 pressure may be controlled using a valve system which controls the rate at which the exhaust gases are drawn from the annular exhaust channel. Other aspects of the MOCVD chamber are described in U.S. patent application Ser. No. 12/023,520, filed Jan. 31, 2008, published as US 2009-0194024, and titled CVD APPARATUS, which is herein incorporated by reference in its entirety.

In certain embodiments, a cleaning gas (e.g., a halogen containing gas, such as chlorine gas) may be delivered into the chamber 202 from the showerhead assembly 304 and/or from inlet ports or tubes (not shown) disposed near the processing volume 308. The cleaning gas enters the processing volume 308 of the chamber 202 to remove deposits from chamber components such as the substrate support 314 and the showerhead assembly 304 and exits the chamber via multiple exhaust ports 309 which are disposed around the annular exhaust channel 305.

The chemical delivery module 303 supplies chemicals to the MOCVD chamber 202. Reactive gases, carrier gases, purge gases, and cleaning gases may be supplied from the chemical delivery system through supply lines and into the chamber 202. In one embodiment, the gases are supplied through supply lines and into a gas mixing box where they are mixed together and delivered to the showerhead assembly 304. Generally supply lines for each of the gases include shut-off valves that can be used to automatically or manually shut-off the flow of the gas into its associated line, and mass flow controllers or other types of controllers that measure the flow of gas or liquid through the supply lines. Supply lines for each of the gases may also include concentration monitors for monitoring precursor concentrations and providing real time feedback, backpressure regulators may be included to control precursor gas concentrations, valve switching control may be used for quick and accurate valve switching capability, moisture sensors in the gas lines measure water levels and can provide feedback to the system software which in turn can provide warnings/alerts to operators. The gas lines may also be heated to prevent precursors and cleaning gases from condensing in the supply lines. Depending upon the process used some of the sources may be liquid rather than gas. When liquid sources are used, the chemical delivery module includes a liquid injection system or other appropriate mechanism (e.g. a bubbler) to vaporize the liquid. Vapor from the liquids is then usually mixed with a carrier gas as would be understood by a person of skill in the art.

Remote microwave plasma system 326 can produce a plasma for selected applications, such as chamber cleaning or etching residue from a process substrate. Plasma species produced in the remote plasma system 326 from precursors supplied via an input line are sent via a conduit for dispersion through the showerhead assembly 304 to the MOCVD chamber 202 via conduit 304D. Precursor gases for a cleaning application may include chlorine containing gases, fluorine containing gases, iodine containing gases, bromine containing gases, nitrogen containing gases, and/or other reactive elements. The remote microwave plasma system 326 may also be adapted to deposit CVD layers flowing appropriate deposition precursor gases into remote microwave plasma system 326 during a layer deposition process. In one embodiment, the remote microwave plasma system 326 is used to deliver active chlorine species to the processing volume 308 for cleaning the interior of the MOCVD chamber 202.

The temperature of the walls of the MOCVD chamber 202 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during an in-situ plasma process, or to limit formation of deposition products on the walls of the chamber. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

Figure 4:
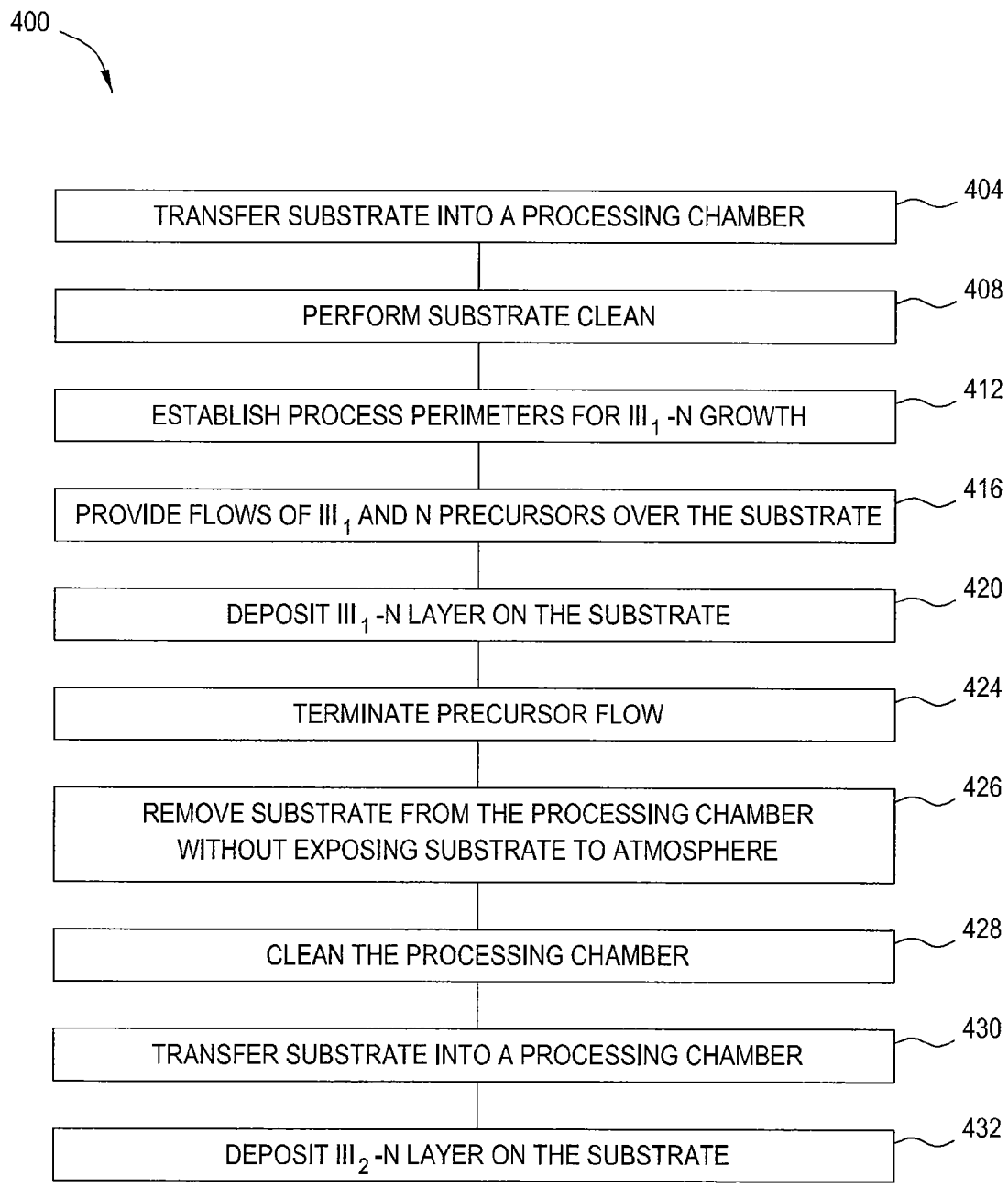
FIG. 4 is a flow diagram of a process that may be used for single chamber compound nitride semiconductor formation according to embodiments described herein.
Figure 4:
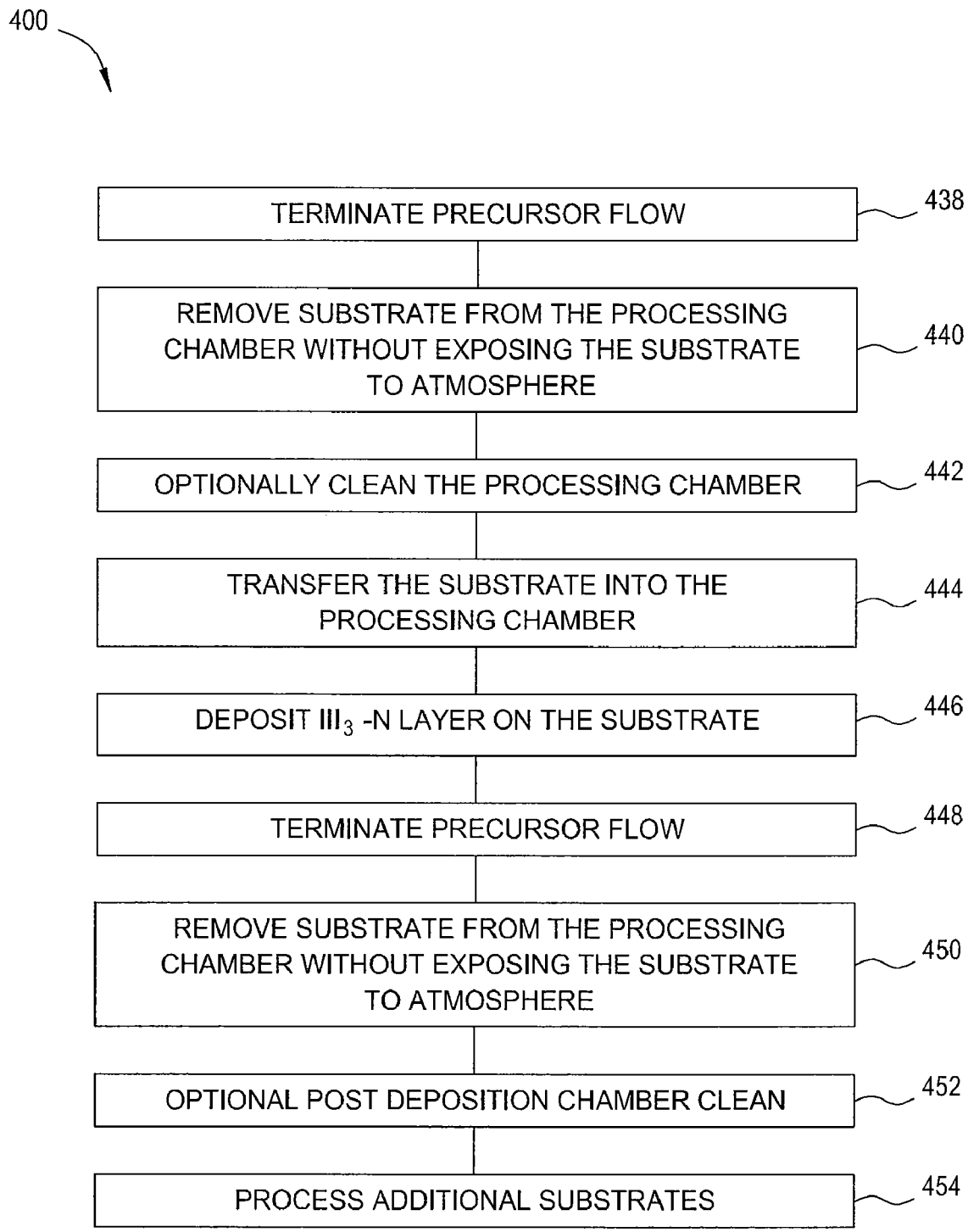

Split Process:

FIG. 4 is a flow diagram of a process 400 that may be used for single chamber compound nitride semiconductor formation according to embodiments described herein. The process begins at block 404 by transferring a substrate into a substrate processing chamber. It should be understood that "a substrate" includes "one or more substrates." In one embodiment, the substrate processing chamber is similar to MOCVD chamber 202. For deposition of a nitride structure, the substrate may comprise sapphire, although other materials that may be used include SiC, Si, spinel, lithium gallate, ZnO, and others. The substrate is cleaned at block 408, after which process parameters suitable for growth of a nitride layer may be established at block 412. Such process parameters may include temperature, pressure, and the like to define an environment within the processing chamber appropriate for thermal deposition of a nitride layer. Flows of precursors are provided at block 416 on the substrate to deposit $III_1$-N structures on the substrate at block 420. The precursors include a nitrogen source and a source for a first group-III element such as Ga. For instance, suitable nitrogen precursors include $NH_3$ and suitable Ga precursors include trimethyl gallium ("TMG") and triethyl gallium (TEG). The first group-III element may sometimes comprise a plurality of distinct group-III elements such as Al and Ga, in which case a suitable Al precursor may be trimethyl aluminum ("TMA"). In another example, the plurality of distinct group-III elements includes In and Ga, in which case a suitable In precursor may be trimethyl indium ("TMI"). A flow of one or more carrier gases selected from the group of argon, nitrogen, hydrogen, helium, neon, xenon, and combinations thereof may also be included.

After deposition of the $III_1$-N structure at block 420, the precursor flows are terminated at block 424. The substrate is removed from the processing chamber without exposing the substrate to atmosphere at block 426. Removing the substrate from the processing chamber without braking vacuum prevents exposure of the deposited $III_1$-N structure to oxygen and carbon which act as electrically active dopants/impurities. At block 428, a cleaning process is performed in which the interior of the processing chamber is exposed to a first cleaning gas to remove contaminants, such as gallium containing deposits, from the chamber and chamber components. In one embodiment, the cleaning process may comprise exposing the chamber to etchant gases which thermally etch deposition from chamber walls and surfaces. Optionally, the processing chamber may be exposed to a plasma during the cleaning process. Cleaning gases for the cleaning process may include halogen containing gases such as fluorine gas ($F_2$), chlorine gas ($Cl_2$), bromine gas ($Br_2$), iodine gas ($I_2$), HI gas, HCl gas, HBr gas, HF gas, $NF_3$, and/or other reactive elements. A flow of one or more carrier gases selected from the group of argon, nitrogen, hydrogen, helium, neon, xenon, and combinations thereof may also be included. In one embodiment, the cleaning process comprises exposing the chamber to a plasma. In one embodiment, the plasma is generated by a remote plasma generator. In another embodiment, the plasma is generated in-situ.

After cleaning, the substrate is transferred back into the processing chamber at block 430 and subsequent deposition steps are performed in the same processing chamber. A $III_2$-N layer is deposited over the $III_1$-N layer on the substrate at block 432.

Deposition of the $III_2$-N layer is performed by establishing suitable processing parameters such as temperature, pressure, and the like for such deposition. In some embodiments, the $III_2$-N structure includes a group-III element that is not comprised by the $III_1$-N layer, although the $III_1$-N and $III_2$-N layers may additionally comprise a common group-III element. For instance, in the case where the $III_1$-N layer is GaN, the $III_2$-N layer may be an AlGaN layer or an InGaN layer. While these are examples in which the $III_2$-N layer has a ternary composition, this is not required and the $III_2$ layer may more generally include such other compositions as quaternary AlInGaN layers. Similarly, in embodiments where the $III_1$-N layer is AlGaN, the $III_2$-N layer may be an InGaN layer or an AlInGaN layer. Suitable precursors for deposition of the $III_2$-N layer may be similar to the precursors used for the $III_1$-N layer, i.e. $NH_3$ is a suitable nitrogen precursor, TMG is a suitable gallium precursor, TEG is a suitable gallium precursor, TMA is a suitable aluminum precursor, and TMI is a suitable indium precursor. A flow of one or more carrier gases selected from the group of argon, nitrogen, hydrogen, helium, neon, xenon, and combinations thereof may also be included.

After deposition of the $III_2$-N layer at block 432, the precursor flows are terminated at block 438. Optionally, the one or more substrates are removed from the processing chamber without exposing the one or more substrates to atmosphere at block 440. Removing the one or more substrates from the processing chamber without braking vacuum prevents exposure of the deposited $III_2$-N structure to oxygen and carbon which act as electrically active dopants/impurities. At block 442, an optional cleaning process may be performed in which the interior of the processing chamber is exposed to a second cleaning gas to remove contaminants, such as group III containing deposits, from the chamber and chamber components.

At block 444, the substrate is transferred under vacuum into the substrate processing chamber. After the one or more substrates are transferred into the processing chamber at block 444 subsequent deposition steps are performed in the processing chamber.

At block 446, process parameters suitable for growth of a $III_3$-N layer may be established. Deposition of the $III_3$-N layer is performed by establishing suitable processing parameters such as temperature, pressure, and the like for such deposition. In some embodiments, the $III_3$-N structure includes a group-III element that is not comprised by either the $III_1$-N layer or the $III_2$-N layer, although the $III_1$-N, the $III_2$-N, and $III_3$-N layers may additionally comprise a common group-III element. For instance, in the case where the $III_1$-N layer is GaN, the $III_2$-N layer may be an InGaN layer, and the $III_3$-N layer may be an AlGaN layer. While these are examples in which the $III_3$-N layer has a ternary composition, this is not required and the $III_3$-N layer may more generally include such other compositions as quaternary AlInGaN layers. Suitable precursors for deposition of the $III_3$-N layer may be similar to the precursors used for the $III_1$-N layer and the $III_2$-N layer, i.e. $NH_3$ is a suitable nitrogen precursor, TMG is a suitable gallium precursor, TEG is a suitable gallium precursor, TMA is a suitable aluminum precursor, and TMI is a suitable indium precursor. A flow of one or more carrier gases selected from the group of argon, nitrogen, hydrogen, helium, neon, xenon, and combinations thereof may also be included.

Optionally, after deposition of the $III_3$-N layer structure, process parameters suitable for growth of a $III_4$-N layer may be established. Such process parameters may include temperature, pressure, and the like to define an environment within the processing chamber appropriate for thermal deposition of a nitride layer. Flows of $III_4$ and nitrogen precursors are provided to deposit $III_4$-N structures on the substrate. The precursors include a nitrogen source and a source for a fourth group-III element such as Ga. For instance, suitable nitrogen precursors include $NH_3$ and suitable Ga precursors include trimethyl gallium ("TMG") and triethyl gallium (TEG). A flow of one or more carrier gases selected from the group of argon, nitrogen, hydrogen, helium, neon, xenon, and combinations thereof may also be included.

At block 448, the precursor flows are terminated. The substrate is removed from the processing chamber without exposing the substrate to atmosphere at block 450.

At block 452 an optional post-deposition chamber clean is performed in which the interior of the processing chamber is exposed to a third cleaning gas to remove contaminants and Group-III containing deposits from the chamber and chamber components prior to the processing of additional substrates at block 454.

The processing conditions used for deposition of the $III_1$-N, $III_2$-N, $III_3$-N, and $III_4$-N layers may vary depending on specific applications. The following table provides exemplary processing conditions and precursor flow rates that are generally suitable in the growth of nitride semiconductor structures using the devices described above:

| Parameter | Value |
| --- | --- |
| Temperature (° C.) | 500-1,200 |
| Pressure (torr) | 0.001-760 |
| TMG flow (sccm) | 0-50 |
| TEG flow (sccm) | 0-50 |
| TMA flow (sccm) | 0-50 |
| TMI flow (sccm) | 0-50 |
| $PH_3$ flow (sccm) | 0-1,000 |
| $AsH_3$ flow (sccm) | 0-1,000 |
| $NH_3$ flow (sccm) | 100-100,000 |
| $N_2$ flow (sccm) | 0-100,000 |
| $H_2$ flow (sccm) | 0-100,000 |

As will be evident from the preceding description, a process might not use flows of all the precursors in any given process. For example, growth of GaN might use flows of TMG, $NH_3$, and $N_2$ in one embodiment; growth of AlGaN might use flows of TMG, TMA, $NH_3$, and $H_2$ in another embodiment, with the relative flow rates of TMA and TMG selected to provide a desired relative Al:Ga stoichiometry of the deposited layer; and growth of InGaN might use flows of TMG, TMI, $NH_3$, $N_2$, and $H_2$ in still another embodiment, with relative flow rates of TMI and TMG selected to provide a desired relative In:Ga stoichiometry of the deposited layer.

Example

The following example is provided to illustrate how the general process may be used for the fabrication of compound nitride structures described in connection with processing system 200. The example refers to a LED structure, with its fabrication being performed using a processing system 200 having one MOCVD chamber 202. In one embodiment, the LED structure is similar to structure 100. The cleaning and deposition of the initial GaN layers and deposition of the remaining InGaN, AlGaN, and GaN contact layers may be performed in the MOCVD chamber 202.

The process begins with a carrier plate 212 containing one or more substrates 340 being transferred into the MOCVD chamber 202. The MOCVD chamber 202 is configured to provide rapid deposition of GaN. A pretreatment process and/or buffer layer is grown over the substrate in the MOCVD chamber 202 using MOCVD precursor gases. This is followed by growth of a thick u-GaN/n-GaN layer, which in this example is performed using MOCVD precursor gases.

After deposition of the u-GaN and n-GaN layer, the carrier plate 212 is transferred out of the MOCVD chamber 202 and into either the loadlock chamber 208 or the batch loadlock chamber 209 without breaking vacuum, with the transfer taking place in a high-purity $N_2$ atmosphere via the transfer chamber 206. After removal of the carrier plate 212, the MOCVD chamber 202 is cleaned with chlorine gas. In one embodiment, an empty carrier plate 212 is inserted into the MOCVD chamber 202 prior to cleaning the chamber and exposed to the cleaning gas while cleaning the MOCVD chamber 202. After the MOCVD chamber 202 is cleaned, the carrier plate 212 is re-inserted into the MOCVD chamber 202 and the InGaN multi-quantum-well (MQW) active layer is grown over the u-GaN and n-GaN layer.

Optionally, in one embodiment, after the MQW active layer is grown, the carrier plate 212 is transferred out of the MOCVD chamber 202 and into either the loadlock chamber 208 or the batch loadlock chamber 209 without breaking vacuum, with the transfer taking place in a high-purity $N_2$ atmosphere via the transfer chamber 206. After removal of the carrier plate 212, the MOCVD chamber 202 is cleaned with chlorine gas.

After the MOCVD chamber 202 is cleaned, the carrier plate 212 is re-inserted into the MOCVD chamber 202 and the p-AlGaN layer and p-GaN layer are deposited over the InGaN MQW active layer.

The completed structure is then transferred out of the MOCVD chamber 202 so that the MOCVD chamber 202 is ready to receive an additional carrier plate 212 with unprocessed substrates. In one embodiment, the MOCVD chamber 202 may be exposed to a post-deposition chamber clean prior to processing additional substrates. The completed structure may either be transferred to the batch loadlock chamber 209 for storage or may exit the processing system 200 via the loadlock chamber 208 and the load station 210.

In one embodiment, multiple carrier plates 212 may be individually transferred into and out of the MOCVD chamber 202 for deposition of the GaN layers, each carrier plate 212 may then be stored in the batch loadlock chamber 209 and/or the loadlock chamber 208 while the MOCVD chamber is cleaned. After the MOCVD chamber is cleaned, each carrier plate 212 may be individually transferred to the MOCVD chamber 202 for deposition of the InGaN multi-quantum-well (MQW) active layer.

In certain embodiments, it may be desirable to clean the carrier plate 212 along with the chamber. After the carrier plate 212 is removed from the MOCVD chamber 202, the substrates 340 are removed from the carrier plate 212 and the carrier plate is re-inserted into the MOCVD chamber 202 for cleaning along with the MOCVD chamber 202.

Figure 5:
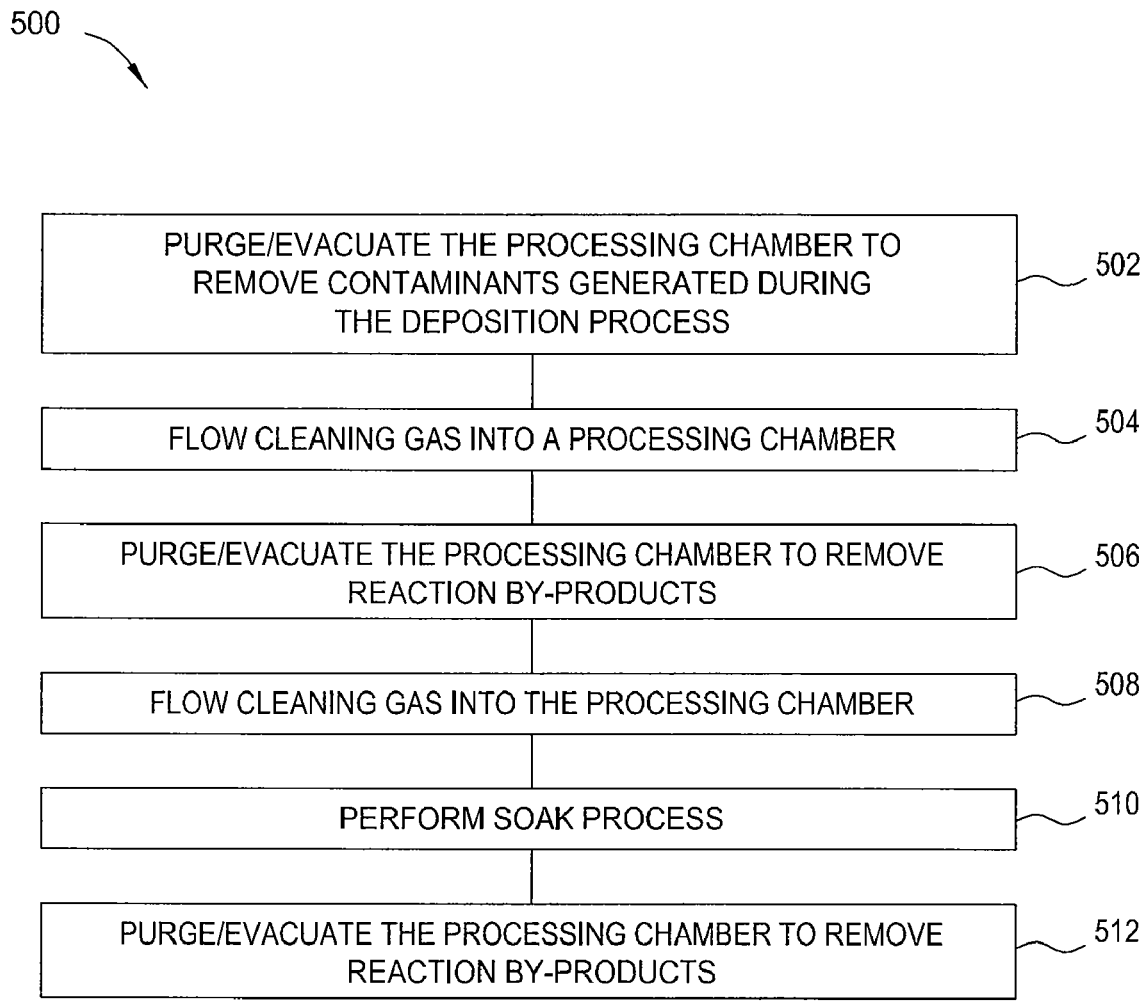
FIG. 5 is a flow diagram of a cleaning process that may be used for MOCVD chamber cleaning according to embodiments described herein.

Exemplary Cleaning Process:

FIG. 5 is a flow diagram of a cleaning process 500 that may be used for MOCVD chamber cleaning according to embodiments described herein. At block 502, the processing chamber is purged/evacuated to remove contaminants generated during the deposition process. The purge/evacuation process of block 502 is similar to the purge/evacuation process described below in block 506 and block 512. As shown in block 504, a cleaning gas is flowed into a processing chamber. The cleaning gas may include any suitable halogen containing gas. Suitable halogen containing gases include fluorine gas, chlorine gas, bromine gas, iodine gas, halides including HI gas, HCl gas, HBr gas, HF gas, $NF_3$, other reactive elements, and combinations thereof. In one embodiment, the cleaning gas is chlorine gas ($Cl_2$). In one embodiment, the processing chamber is an MOCVD chamber similar to the chamber 202.

In certain embodiments, the flow rates in the present disclosure are expressed as sccm per interior chamber volume. The interior chamber volume is defined as the volume of the interior of the chamber in which a gas can occupy. For example, the interior chamber volume of chamber 202 is the volume defined by the chamber body 302 minus the volume occupied therein by the showerhead assembly 304 and by the substrate support assembly 314. In certain embodiments, the cleaning gas may be flowed into the chamber at a flow rate of about 500 sccm to about 10,000 sccm. In one embodiment, the cleaning gas is flowed into the chamber at a flow rate from about 1,000 sccm to about 4,000 sccm. In one embodiment, the cleaning gas is flowed into the chamber at a flow rate of about 2,000 sccm. In one embodiment, the cleaning gas may be flowed into the chamber at a flow rate of about 12.5 sccm/L to about 250 sccm/L. In one embodiment, the cleaning gas is flowed into the chamber at a flow rate from about 25 sccm/L to about 100 sccm/L. In one embodiment, the cleaning gas is flowed into the chamber at a flow rate of about 50 sccm/L.

In one embodiment, the cleaning gas may be co-flowed with a carrier gas. The carrier gas may be one or more gases selected from the group of argon, nitrogen, hydrogen, helium, neon, xenon, and combinations thereof. In one embodiment, the carrier gas is flowed into the chamber at a flow rate from about 500 sccm to about 3,000 sccm. In one embodiment, the carrier gas is flowed into the chamber at a flow rate of from about 1,000 sccm to about 2,000 sccm. In one embodiment, the carrier gas is flowed into the chamber at a flow rate from about 12.5 sccm/L to about 75 sccm/L. In one embodiment, the carrier gas is flowed into the chamber at a flow rate of from about 25 sccm/L to about 50 sccm/L. In one embodiment, a total pressure of the chamber is from about 0.001 Torr to about 500 Torr. In one embodiment, the total pressure of the chamber is from about 50 Torr to about 200 Torr. In one embodiment, the total pressure of the chamber is about 100 Torr. Lower pressure is generally favored to keep $GaCl_3$ in gaseous phase. In one embodiment, a temperature of the susceptor is from about 500° C. to about 700° C. In one embodiment, the temperature of the susceptor is from about 550° C. to about 700° C. In one embodiment, the temperature of the susceptor is about 650° C. In one embodiment, a temperature of the showerhead is from about 100° C. to about 200° C. The cleaning gas may be flowed into the processing chamber for a time period of about 2 minutes to about 10 minutes. In one embodiment, the cleaning gas may be flowed into the processing chamber for a time period of about 5 minutes. It should be understood that several cycles of cleaning may apply with an optional purge process performed in between cleaning cycles. The time period of cleaning gas flow should be generally long enough to remove gallium containing deposits, such as gallium and GaN deposits, from the surface of the chamber and the surface of the chamber components including the showerhead. In one embodiment, a carrier gas may be flown in conjunction with the cleaning gas. The carrier gas may be one or more gases selected from the group of argon, nitrogen ($N_2$), helium, neon, and xenon, among others. In one embodiment, the cleaning gas is a plasma containing cleaning gas. In one embodiment, the plasma containing cleaning gas is formed remotely using a remote plasma generator. In one embodiment, the plasma containing gas is formed in-situ within the processing chamber.

Referring to block 506, after the flow or pulse of the cleaning gas has ceased, the processing chamber is purged/evacuated to remove cleaning by-products generated during the cleaning process. The purge gas may be one or more purge gases selected from the group of argon, nitrogen, hydrogen, helium, neon, xenon, and combinations thereof may also be included. In one embodiment, the purge gas may be identical to the optional carrier gas of block 504. In one embodiment, the processing chamber is purged by providing a purge gas at a flow rate of about 1,000 sccm to about 7,000 sccm. In one embodiment, the purge gas is provided to the processing chamber at a flow rate from about 2,000 sccm to about 4,000 sccm. In one embodiment, the processing chamber is purged by providing a purge gas at a flow rate of about 25 sccm/L to about 175 sccm/L. In one embodiment, the purge gas is provided to the processing chamber at a flow rate from about 50 sccm/L to about 160 sccm/L. In one embodiment, the chamber may be maintained at a total chamber pressure from about 0.001 Torr to about 10 Torr. In one embodiment, the total pressure of the chamber may be about 5 Torr. In one embodiment, a temperature of the susceptor is from about 600° C. to about 1,000° C. In one embodiment, the temperature of the susceptor is about 900° C. In one embodiment, a temperature of the showerhead is less than 100° C. In one embodiment, the purge gas may be flowed into the processing chamber for a time period of about 5 minutes. The time period of purge gas flow should be generally long enough to remove by-products of the cleaning process of block 504 from the processing chamber.

Alternatively, or in addition to introducing the purge gas, the process chamber may be depressurized in order to remove the residual cleaning gas as well as any by-products from the processing chamber. The depressurization process may result in the chamber pressure being reduced to a pressure in the range of about 0.001 Torr to about 40 Torr within a time period of about 0.5 seconds to about 20 seconds.

In embodiments where a carrier gas is used in conjunction with the cleaning gas in block 504, the purge process of block 506 may be performed by ceasing the flow of the cleaning gas while continuing to flow the carrier gas. Thus allowing the carrier gas to function as the purge gas in the purge process of block 506.

As shown in block 508, after the processing chamber is purged/evacuated at block 506 an optional cleaning gas is flowed into the processing chamber. The cleaning gas may include halogen containing gases such as fluorine gas, chlorine gas, iodine gas, bromine gas, HI gas, HCl gas, HBr gas, HF gas, $NF_3$, other reactive elements, and combinations thereof. In one embodiment, the cleaning gas is chlorine gas ($Cl_2$). In one embodiment, the cleaning gas in block 508 is identical to the cleaning gas used in block 504. In another embodiment, the cleaning gases used in block 504 and block 508 are different cleaning gases.

In one embodiment, the cleaning gas may be flowed into the chamber at a flow rate from about 1,000 sccm to about 10,000 sccm. In one embodiment, the cleaning gas may be flowed into the chamber at a flow rate from about 3,000 sccm to about 5,000 sccm. In one embodiment, the cleaning gas may be flowed into the processing chamber at a flow rate of about 4,000 sccm. In one embodiment, the cleaning gas may be flowed into the chamber at a flow rate from about 25 sccm/L to about 250 sccm/L. In one embodiment, the cleaning gas may be flowed into the chamber at a flow rate from about 75 sccm/L to about 125 sccm/L. In one embodiment, the cleaning gas may be flowed into the processing chamber at a flow rate of about 100 sccm/L. As discussed above, a carrier gas may optionally be co-flowed in conjunction with the cleaning gas. The carrier gas may be one or more gases selected from the group of argon, nitrogen, hydrogen, helium, neon, xenon, and combinations thereof. In one embodiment, the carrier gas is flowed into the chamber at a flow rate from about 1,000 sccm to about 5,000 sccm. In one embodiment, the carrier gas is flowed into the chamber at a flow rate from about 2,000 sccm to about 3,000 sccm. In one embodiment, the carrier gas is flowed into the chamber at a flow rate from about 25 sccm/L to about 125 sccm/L. In one embodiment, the carrier gas is flowed into the chamber at a flow rate from about 50 sccm/L to about 75 sccm/L. In one embodiment, the chamber may be maintained at a total chamber pressure of about 300 Torr to about 700 Torr. In one embodiment, the chamber may be maintained at a total chamber pressure of about 600 Torr. In one embodiment, a temperature of the susceptor is about 400° C. to about 600° C. In one embodiment, the temperature of the susceptor is about 420° C. In one embodiment, a temperature of the showerhead is greater than 200° C. In one embodiment, the showerhead temperature is greater than 260° C., for example, from about 260° C. to about 400° C. The cleaning gas may be flowed into the processing chamber for a time period of about 2 minutes to about 10 minutes. In one embodiment, the cleaning gas may be flowed into the processing chamber for a time period of about 3 minutes.

As shown in block 510, after flowing the cleaning gas into the processing chamber, an optional soak process may be performed. During the soak process, the flow of cleaning gas is reduced while the susceptor temperature, showerhead temperature, and the chamber pressure may be maintained. In one embodiment, the flow rate of the cleaning gas may be reduced relative to the flow rate in block 508 to between about 250 sccm to about 1,000 sccm. In one embodiment, the flow rate of the cleaning gas may be reduced to about 500 sccm. In one embodiment, the flow rate of the cleaning gas may be reduced relative to the flow rate in block 508 to between about 6.25 sccm/L to about 25 sccm/L. In one embodiment, the flow rate of the cleaning gas may be reduced to about 12.5 sccm/L. In one embodiment, a total pressure of the chamber is from about 300 Torr to about 700 Torr. In one embodiment, the total pressure of the chamber is about 600 Torr. In one embodiment, the susceptor temperature is from about 400° C. to about 600° C. In one embodiment, the susceptor temperature is about 420° C. In one embodiment, a temperature of the showerhead is greater than 200° C. In one embodiment, the showerhead temperature is greater than 260° C., for example, from about 260° C. to about 400° C. The soak process may be performed for a time period of about 1 minute to about 5 minutes. In one embodiment, the soak process may be performed for a time period of about 2 minutes.

Referring to block 512, after the optional soak process, the processing chamber may be purged/evacuated to remove cleaning by-products generated during the soak and cleaning processes. The purge gas may be one or more purge gases selected from the group of argon, nitrogen, hydrogen, helium, neon, xenon, and combinations thereof. In one embodiment, the purge gas may be identical to the optional carrier gas of block 510. In one embodiment, the processing chamber is purged by providing a purge gas at a flow rate of about 1,000 sccm to about 4,000 sccm. In one embodiment, the purge gas may be flowed into the processing chamber at a flow rate of about 3,000 sccm. Optionally, during the purge process the cleaning gas may be flowed into the chamber at a flow rate from about 2,000 sccm to about 6,000 sccm. In one embodiment, the cleaning gas may be flowed into the chamber at a flow rate of about 4,000 sccm. In one embodiment, the processing chamber is purged by providing a purge gas at a flow rate of about 25 sccm/L to about 100 sccm/L. In one embodiment, the purge gas may be flowed into the processing chamber at a flow rate of about 75 sccm/L. Optionally, during the purge process the cleaning gas may be flowed into the chamber at a flow rate from about 50 sccm/L to about 150 sccm/L. In one embodiment, the cleaning gas may be flowed into the chamber at a flow rate of about 100 sccm/L. In one embodiment, the cleaning gas is co-flowed with the purge gas. In one embodiment, the total chamber pressure is from about 0.001 Torr to about 10 Torr. In one embodiment, the total chamber pressure is about 5 Torr. In one embodiment, the susceptor temperature is from about 400° C. to about 600° C. In one embodiment, the susceptor temperature is about 430° C. In one embodiment, the showerhead temperature is greater than 200° C. In one embodiment, the showerhead temperature is greater than 260° C., for example, from about 260° C. to about 400° C. The soak process may be performed for a time period of about 1 minute to about 5 minutes. In one embodiment, the soak process may be performed for a time period of about 2 minutes. In one embodiment, the purge gas may be flowed into the processing chamber for a time period of about 5 minutes. The time period of purge gas flow should be generally long enough to remove by-products of the cleaning process of block 508 and the soak process of block 510 from the processing chamber.

In one embodiment, either or both of the purge processes of block 502, block 506, and block 512 may be performed with a nitrogen containing gas such as ammonia ($NH_3$) at an elevated temperature (>1,000° C.) to reduce the amount of residual $GaCl_3$ in the processing chamber after the cleaning process. Optionally, a chamber bake process may be performed after any of the aforementioned purge processes in a nitrogen and/or hydrogen containing atmosphere at a high temperature from about 950° C. to about 1,050° C. at a low pressure from about 0.001 Torr to about 5 Torr to ensure that any residual deposition from the chamber clean process leave the chamber completely. Other aspects or exemplary cleaning processes are described in U.S. patent application Ser. No. 12/244,440, now published as US 2009-0149008, titled METHOD FOR DEPOSITING GROUP III/V COMPOUNDS, filed Oct. 2, 2008, which is hereby incorporated by reference in its entirety.

Figure 6A:
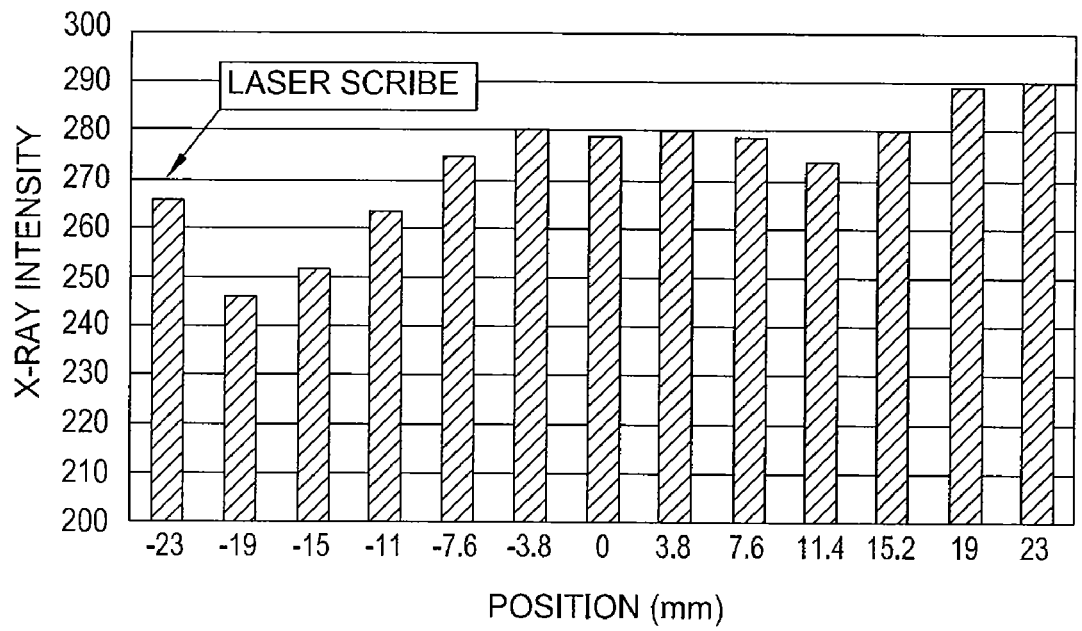
FIG. 6A is a plot demonstrating In X-Ray Fluorescence for In distribution across the surface of a substrate for In deposited using prior art processes.
Figure 6B:
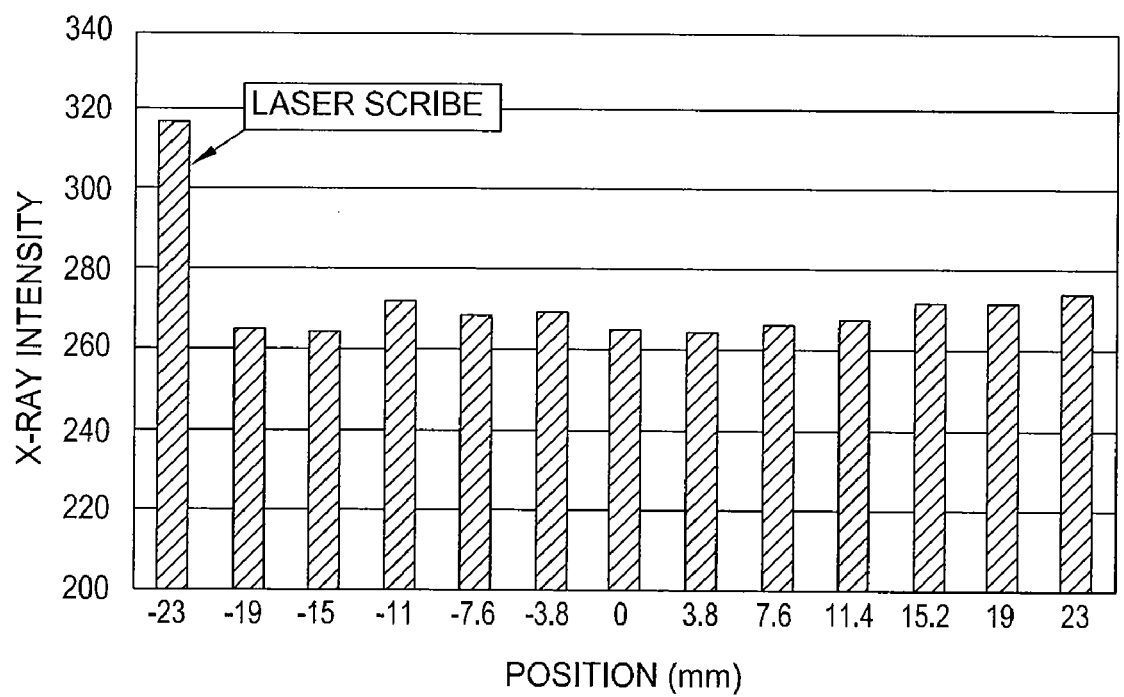
FIG. 6B is a plot demonstrating In X-Ray Fluorescence for indium distribution across the surface of a substrate for indium deposited according to embodiments described herein.

FIG. 6A is a plot demonstrating In X-Ray Fluorescence for indium (In) distribution across the surface of a substrate for In deposited using prior art processes. FIG. 6B is a plot demonstrating In X-Ray Fluorescence for In distribution across the surface of a substrate for In deposited according to embodiments described herein. With reference to FIGS. 6A and 6B, the x-axis represents location relative to the center of the substrate in millimeters (mm) and the y-axis represents indium X-ray fluorescence intensity. The prior art process used to obtain the results depicted in FIG. 6A was an in-situ process where a GaN layer and InGaN layers were deposited in the same chamber without the benefit of the split process methods described herein. The process used to obtain the results depicted in FIG. 6B was performed using an in-situ process wherein a chamber clean was performed after formation of the GaN layer and prior to the deposition of the InGaN layer within the same chamber. The results depicted in FIG. 6B show a more uniform distribution of indium across the substrate for a single chamber split process with a chamber clean after high-temperature GaN deposition (both uGaN and nGaN) prior to MQWs growth in comparison with the results depicted in FIG. 6A obtained using the prior art process.

While the foregoing is directed to embodiments of the present invention, other and further embodiments of the invention may be devised without departing from the basic scope thereof, and the scope thereof is determined by the claims that follow.

The invention claimed is:

1. A method for fabricating a compound nitride structure, comprising:

depositing a first layer over one or more substrates in a processing chamber using a first group-III precursor comprising a first group-III element and a first nitrogen containing precursor, wherein the first layer comprises nitrogen and the first group-III element;

removing the one or more substrates from the processing chamber after depositing the first layer without exposing the one or more substrates to atmosphere;

flowing a first cleaning gas into the processing chamber after removing the one or more substrates from the processing chamber to remove at least a portion of the first layer disposed on a surface of the processing chamber;

transferring the one or more substrates into the processing chamber without exposing the one or more substrates to atmosphere after removing at least a portion of the first layer; and depositing a second layer over the first layer in the processing chamber using a second group-III precursor and a second nitrogen containing precursor, wherein the second group-III precursor comprises a second group-III element not comprised by the first group-III precursor.

2. The method of claim 1, further comprising:

removing the one or more substrates from the processing chamber without exposing the one or more substrates to atmosphere after depositing the second layer;

flowing a second cleaning gas into the processing chamber to remove at least a portion of the second layer disposed on a surface of the processing chamber after removing the one or more substrates from the processing chamber after depositing the second layer;

transferring the one or more substrates into the processing chamber without exposing the one or more substrates to atmosphere after flowing the second cleaning gas into the processing chamber;

depositing a third layer over the one or more substrates in the processing chamber using a third group-III precursor comprising a third group-III element and a third nitrogen containing precursor, the third layer comprising nitrogen and the third group-III element; and depositing a fourth layer over the one or more substrates in the processing chamber using a fourth group-III precursor comprising a fourth group-III element and a fourth nitrogen containing precursor, the fourth layer comprising nitrogen and the fourth group-III element.

3. The method of claim 2, further comprising:

removing the one or more substrates from the processing chamber without exposing the one or more substrates to atmosphere after depositing the fourth layer;

flowing a third cleaning gas into the processing chamber to perform a post-deposition clean to remove at least a portion of the fourth layer disposed on a surface of the processing chamber after removing the one or more substrates from the processing chamber after depositing a fourth layer.

4. The method of claim 3, wherein transferring the one or more substrates into the processing chamber comprises transferring the substrate in an environment having greater than 90% inert gas.

5. The method of claim 3, further comprising:

purging the processing chamber after flowing the third cleaning gas into the processing chamber; and performing a chamber bake process in a nitrogen and/or hydrogen containing atmosphere at a temperature from about 950° C. to about 1,050° C. at a chamber pressure from about 0.001 Torr to about 5 Torr after purging the processing chamber.

6. The method of claim 2, wherein the first cleaning gas and the second cleaning gas are a halogen containing gas each individually selected from the group consisting of: fluorine gas, chlorine gas, bromine gas, iodine gas, HI gas, HCl gas, HBr gas, HF gas, and combinations thereof.

7. The method of claim 6, wherein:

the first group III element is gallium;
the second group III element is indium;
the third group III element is aluminum;
the fourth group III element is gallium;
the first layer comprises a gallium nitride (GaN) layer;
the second layer comprises an indium gallium nitride (InGaN) layer;
the third layer comprises a p-doped aluminum gallium nitride (AlGaN) layer; and
the fourth layer comprises a p-doped GaN layer.

8. The method of claim 1, wherein the portion of the first layer predominantly comprises Ga-rich gallium nitride (GaN) deposited on components of the processing chamber including a showerhead.

9. The method of claim 1, further comprising:

purging the processing chamber after removing the one or more substrates from the processing chamber and prior to flowing the first cleaning gas into the processing chamber; and purging the processing chamber after flowing the first cleaning gas into the processing chamber.

10. A method for fabricating a compound nitride structure, comprising:

positioning one or more substrates on a susceptor in a processing region of a metal organic chemical vapor deposition (MOCVD) chamber comprising a showerhead;

depositing a gallium nitride (GaN) layer over the one or more substrates with a thermal chemical-vapor-deposition process within the MOCVD chamber by flowing a first gallium containing precursor and a first nitrogen containing precursor through the showerhead into the MOCVD chamber;

removing the one or more substrates from the MOCVD chamber without exposing the one or more substrates to atmosphere;

flowing a chlorine gas into the processing chamber to remove at least a portion of the GaN layer from the showerhead;

transferring the one or more substrates into the MOCVD chamber after removing the portion of the GaN layer from the showerhead; and depositing an indium gallium nitride (InGaN) layer over the GaN layer with a thermal chemical-vapor-deposition process within the MOCVD chamber by flowing a second gallium containing precursor, an indium containing precursor, and a second nitrogen containing precursor into the MOCVD chamber.

11. The method of claim 10, further comprising:

flowing a first purge gas into the MOCVD chamber prior to transferring the one or more substrates into the MOCVD chamber.

12. The method of claim 11, further comprising:

flowing a cleaning gas into the MOCVD chamber after purging the MOCVD chamber; and flowing a second purge gas into the MOCVD chamber after flowing the cleaning gas into the MOCVD chamber.

13. The method of claim 12, wherein the chlorine gas is flowed into the MOCVD chamber at a flow rate from about 1,000 sccm to about 4,000 sccm, at a total chamber pressure from about 0.001 Torr to 100 Torr, a susceptor temperature from about 600° C. to about 700° C., and a showerhead temperature from about 100° C. to about 200° C.

14. The method of claim 13, wherein the first purge gas is flowed into the MOCVD chamber at a flow rate of about 1,000 sccm to about 5000 sccm, at a total chamber pressure of about 0.001 Torr to about 10 Torr, a susceptor temperature of about 900° C., and a showerhead temperature of less than 100° C.

15. The method of claim 14, wherein the cleaning gas is flowed into the MOCVD chamber at a flow rate of about 3,000 sccm to about 5,000 sccm, at a total chamber pressure of about 300 Torr to about 700 Torr, a susceptor temperature of about 400° C. to about 600° C., and a showerhead temperature from about 260° C. to about 400° C.

16. The method of claim 15, wherein the second purge gas is provided at a flow rate from about 1,000 sccm to about 4,000 sccm, at a total chamber pressure of from about 0.001 Torr to about 10 Torr, at a susceptor temperature from about 400° C. to about 600° C., and at a showerhead temperature greater than 200° C.

17. The method of claim 16, wherein removing the substrate from the MOCVD chamber comprises transferring the substrate to a loadlock chamber in an atmosphere having greater than 90% $N_2$.

* * * * *